United States Patent [19]

Block

[11] Patent Number: 4,593,258

[45] Date of Patent: Jun. 3, 1986

[54] ENERGY CONSERVING APPARATUS FOR REGULATING TEMPERATURE OF MONITORED DEVICE

[76] Inventor: Gerald Block, 45 Chirstopher St., New York, N.Y. 10014

[21] Appl. No.: 701,092

[22] Filed: Feb. 13, 1985

[51] Int. Cl.$^4$ .............................................. H03L 1/04
[52] U.S. Cl. ..................................... 331/176; 331/66; 310/315; 219/210
[58] Field of Search ...................... 331/66, 69, 70, 176; 310/315, 341, 346; 219/209, 210, 494

[56] References Cited

U.S. PATENT DOCUMENTS 3,413,438  11/1968  Gardner et al. .................... 219/210
4,297,657  10/1981  Frerking ........................... 331/66 X Primary Examiner—Eugene R. LaRoche
Assistant Examiner—Robert J. Pascal
Attorney, Agent, or Firm—Kenyon & Kenyon

[57] ABSTRACT

An apparatus for controlling the temperature of a device whose temperature is to be stabilized within a preset range is disclosed. The apparatus is particularly applicable to stabilizing the temperature, and thus frequency of operation of, a crystal controlled oscillator, without expending additional energy in specialized crystal heating apparatus. The apparatus preferably includes first and second power supply regulators coupled to a source of unregulated voltage. The second power supply regulator preferably has a higher output voltage than the first power supply regulator and the outputs of the two regulators are coupled together. The cyrstal is attached to the second regulator so that heat generated by the second regulator is dissipated in the crystal. A temperature sensing device is coupled to the crystal and generates a signal proportional to the temperature of the crystal. The signal from the temperature sensing device is fed to a comparator which compares the signal from the temperature sensing device with a reference voltage. The output of the comparator is then coupled back to a control input of the second regulator so as to turn the second regulator off and first regulator on when the temperature of the crystal exceeds a preset value. When the crystal temperature decreases, the second regulator is turned on, and the first regulator off. Accordingly, heat from a power supply regulator, which would otherwise be dissipated in a heat sink, is used to maintain the temperature of the crystal within a preset range.

9 Claims, 1 Drawing Figure

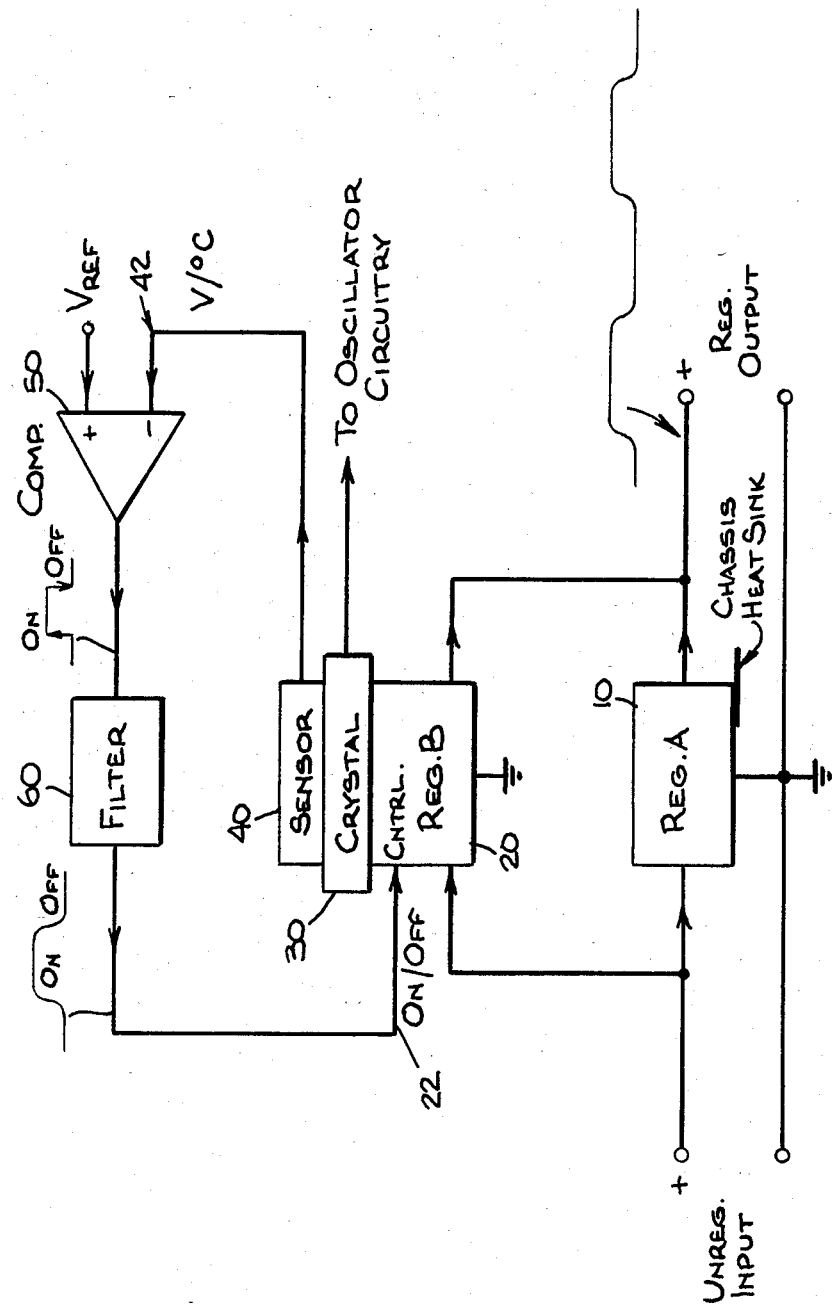

ENERGY CONSERVING APPARATUS FOR REGULATING TEMPERATURE OF MONITORED DEVICE

BACKGROUND OF THE INVENTION

The present invention relates to apparatus for regulating the temperature of a device whose temperature must be carefully controlled, and in particular, to an apparatus for regulating the temperature, and thus the frequency of oscillation of a crystal of a crystal controlled oscillator. The present invention operates in conjunction with a power supply of an electronic circuit, and thus generally relates to the field of power supplies also.

In many electronic circuits, the temperature of a component of the circuit must be regulated within precise limits. For example, in many circuits, a crystal controlled oscillator is used for providing the various clock frequencies required for timing and synchronizing purposes in the circuitry. In many instances, the frequency of operation of the crystal which controls the oscillator must be regulated within precise limits. For example, variation in temperature may affect the frequency of oscillation of the crystal. In order to maintain a stable temperature, and thus maintain the frequency substantially constant, a special heater may be provided to maintain the temperature of the crystal within a certain range. This however, is wasteful of energy since a larger power supply or a special power supply is needed to provide for the power requirements for the heater necessary to provide temperature compensation for the crystal. See, e.g., U.S. Pat. Nos. 4,396,892, 3,109,082, 3,413,438, 4,479,096, 4,157,466, and 3,158,821 as illustrative of the prior art.

SUMMARY OF THE INVENTION

It is, therefore, an object of the present invention to provide an apparatus for regulating the temperature of a device whose temperature must be maintained within preset limits.

It furthermore is an object of the present invention to provide an apparatus for regulating the temperature of a device, such as a crystal of a crystal controlled oscillator, which utilizes energy which otherwise would be wasted in the power supply which supplies power to associated electronic circuitry to which the device is coupled for providing the necessary temperature regulation.

It is yet another object of the present invention to provide apparatus for controlling the temperature, and thus the frequency of operation of a crystal oscillator, which operates in conjunction with the power supply of the electronic circuitry to which the crystal oscillator is attached.

It furthermore is yet another object of the present invention to provide a modified power supply which provides the necessary temperature compensation for a device whose temperature is to be stabilized, such as a crystal of a crystal controlled oscillator, but which at the same time does not require that substantial amounts of additional energy be dissipated.

These and other objects of the present invention are provided by an apparatus for controlling the temperature of a device whose temperature is to be stabilized within a preset range comprising first power supply regulator means coupled to a source of unregulated voltage and having a first regulated output voltage at an output thereof, second power supply regulator means coupled to the source of unregulated voltage and having a second output voltage at an output thereof, the outputs of the first and second regulator means being coupled together, the device whose temperature is to be stabilized being coupled to one of the regulator means so that heat generated by the one of the regulator means is dissipated in the device, temperature sensing means coupled to the device for generating a first signal proportional to the temperature of the device, and means coupled to said sensor means for generating a second signal when the temperature of the device is outside the preset range, one of the regulator means having a control imput responsive to the second signal whereby the heat generated by the regulator means to which the device is coupled and dissipated in the device may be controlled.

Other objects, features and advantages of the present invention will be apparent from the detailed description which follows below.

BRIEF DESCRIPTION OF THE DRAWING

The invention will be explained in greater detail in the following detailed description with reference to the single drawing figure, which is a block diagram of the apparatus according to the present invention.

DETAILED DESCRIPTION

With reference now to the drawing figure, the apparatus of the present invention for controlling the temperature of a device whose temperature is to be stabilized is shown. In particular, the device whose temperature is to be stabilized may be a crystal of a crystal controlled oscillator. Stabilizing the crystal temperature aids in stabilizing the frequency of oscillation of the crystal oscillator.

The apparatus of the invention may include a first power supply voltage regulator 10 (REG. A) and a second power supply voltage regulator 20 (REG.B). Regulator 10 and regulator 20 are connected in parallel as shown. The unregulated input voltage is coupled to each of regulators 10 and 20 and the outputs of regulators 10 and 20 are coupled together and supplied as the regulated output to supply power to the remainder of the electronic circuitry. Preferably, regulator 20 is adjusted so that its regulated output voltage is slightly higher than the output voltage provided by regulator 10. For example, if the output voltage of regulator 10 is 5.0 volts, the output voltage of regulator 20 might be 5.2 volts. Regulator 10 may be thought of as providing the primary voltage regulation function. Accordingly, it is mechanically coupled to the chassis of the electronic circuit or to a heat sink so that the heat generated by it is dissipated. Regulator 20 may include an on/off control input 22, so that when regulator 20 is turned off, regulator 10 provides the voltage regulating function and the output voltage is determined by regulator 10. Once regulator 20 is turned on, however, due to its parallel coupling with regulator 10, regulator 20 provides the regulating function since its output voltage is slightly higher than that of regulator 10, and it "steals" current from regulator 10, forcing regulator 10 off. Accordingly, regulator 10 is turned off when regulator 20 turns on and regulator 20 provides power to the electronic circuitry.

The device whose temperature is to be stabilized, e.g., crystal 30 of a crystal controlled oscillator, preferably is mechanically coupled to regulator 20, as shown, so that the heat generated by regulator 20 when it is providing the regulating function is dissipated in the crystal, therefore heating the crystal. A temperature sensor 40 is also mechanically coupled to the crystal and generates a signal whose voltage is proportional to the temperature of the crystal. This signal is present on the line 42. Line 42 is coupled, for example, to the inverting input of a comparator 50. The non-inverting input of the comparator is coupled to a source of reference voltage. Accordingly, if regulator 20 is turned on so that it is providing the regulating function of the power supply, heat is being dissipated in the crystal and the sensor 40 generates a signal dependent upon the temperature of the crystal. If this signal is less than the reference voltage of the comparator 50, the comparator output will be a positive voltage, in the illustrated embodiment. This positive voltage is supplied to a filter 60 which provides a delay and smoothing function. The positive output voltage of filter 60 is supplied to the control input of regulator 20, so that regulator 20 continues to provide the regulating function. As soon as the temperature of crystal 30, as determined by sensor 40, reaches the reference voltage of comparator 50, comparator 50 generates a logic 0 signal, which is filtered by filter 60. This logic 0 signal is coupled to the control input of regulator 20, thereby turning regulator 20 off. Since regulator 20 is no longer providing the regulating function, regulator 10 automatically takes over and the regulated output voltage drops to the output voltage determined by regulator 10. In an illustrative embodiment, the output voltage may drop from 5.2 volts, the output of regulator 20, to 5 volts, the output of regulator 10. This small change in regulated output voltage generally is insufficient to cause problems in the electronic circuitry to which the power supply supplies power. Filter 60 is provided in order to provide a smooth transition between the two voltages. When the temperature of crystal 30 again drops below a preset limit, comparator 50 generates a signal to turn regulator 20 on again to heat the crystal. Eventually, the crystal again will be heated to a sufficient temperature so that regulator 20 is turned off and regulator 10 on again. The process thus continues in a cyclical manner.

The present invention therefore provides an advantageous way of regulating the temperature of a device whose temperature is to be stabilized, and preferably, if the device is a crystal of a crystal controlled oscillator, the temperature and, therefore, frequency of operation of the crystal. Because the heat dissipated by the regulator of an electronic power supply would be dissipated in any event in the heat sink or the chassis, and because regulator 20 takes over from regulator 10 when regulator 20 is turned on, little additional energy is wasted in order to stabilize the crystal temperature other than that dissipated due to the slightly lower output voltage of regulator 10.

Various modifications to the apparatus described can be made. For example, the crystal 30 could be mechanically coupled to regulator 10, while the control voltage on line 22 still is provided to regulator 20. An inverting stage between the comparator and control input of regulator 20 may then be necessary. Alternatively, the sensor input could be coupled to the noninverting input of the comparator. Furthermore, the invention has broad application and could be used to stabilize the temperature of devices other than crystals of crystal controlled oscillators, e.g., any other device whose temperature must be maintained accurately. Other modifications readily will be apparent to one of skill in the art.

Other modifications which could be made include having both regulators 10 and 20 output the same voltage in which case suitable control means coupled to sensor 40 could be provided to switch between the two regulators. Furthermore, other modifications could be made such that the regulators are continuously controlled to provide the necessary temperature compensation instead of the on-off control described with reference to the exemplary embodiment. For example, both regulators could be controlled such that each supplies part of the current requirements for the circuit being powered, and thus both regulators dissipate heat at the same time. Alternatively, an on-off control could be provided which comprises a pulse width modulated or varying duty cycle signal to one of the regulators, the regulator being responsive to the duty cycle of the control signal.

In the foregoing specification, the invention has been described with reference to a specific exemplary embodiment thereof. It will, however, be evident that various modifications and changes may be made thereunto without departing from the broader spirit and scope of the invention as set forth in the appended claims. The specification and drawing are, accordingly, to be regarded in an illustrative rather than a restrictive sense.

What is claimed is:

1. Apparatus for controlling the temperature of a device whose temperature is to be stabilized within a preset range comprising:
   first power supply regulator means coupled to a source of unregulated voltage and having a first regulated output voltage at an output thereof;
   second power supply regulator means coupled to said source of unregulated voltage and having a second output voltage at an output thereof, said output of said first and second regulator means being coupled together, said device whose temperature is to be stabilized being coupled to one of said regulator means so that heat generated by the one of said regulator means is dissipated in said device;
   temperature sensing means coupled to said device for generating a first signal proportional to the temperature of said device; and
   means coupled to said sensor means for generating a second signal when the temperature of said device is outside the preset range, one of said regulator means having a control imput responsive to said second signal whereby the heat generated by the regulator means to which the device is coupled and dissipated in said device may be controlled.

2. The apparatus recited in claim 1 wherein the device is coupled to said second regulator means and said second regulated output voltage is higher than said first regulated output voltage.

3. The apparatus recited in claim 2, wherein said second regulator means has a control input responsive to said second signal.

4. The apparatus recited in claim 3, wherein said second regulator means is alternately turned on and off by said second signal in order to maintain the temperature of the device within said preset range.

5. The apparatus recited in claim 4, wherein, when said second regulator means is turned on, said first regulator means is turned off, and when said second regulator means is turned off, said first regulator means is turned on.

6. The apparatus recited in claim 1, wherein said means for generating a second signal comprises comparator means for comparing said first signal to a reference signal.

7. The apparatus recited in claim 6, further comprising means coupled to an output of said comparator means for filtering said second signal.

8. The apparatus recited in claim 1, wherein said device is a crystal of a crystal controlled oscillator.

9. The apparatus recited in claim 1, wherein said device is mechanically fastened to said one of said regulator means.

* * * * *